(12) United States Patent  
Takagi

(10) Patent No.: US 8,344,462 B2
(45) Date of Patent: Jan. 1, 2013

(54) MOUNTING DEVICE FOR A SEMICONDUCTOR PACKAGE

(75) Inventor: Kazutaka Takagi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1299 days.

(21) Appl. No.: 11/850,996

(22) Filed: Sep. 6, 2007

(65) Prior Publication Data

US 2008/0023826 A1    Jan. 31, 2008

Related U.S. Application Data

(63) Continuation of application No. PCT/JP2007/000185, filed on Mar. 8, 2007.

(30) Foreign Application Priority Data

Mar. 10, 2006 (JP) .................................. 2006-065767

(51) Int. Cl.
*H01L 23/24* (2006.01)

(52) U.S. Cl. .................................. 257/398; 257/E23.08

(58) Field of Classification Search .................. 257/698, 257/E23.08; 361/688; 333/247
See application file for complete search history.

(56) References Cited

U.S. PATENT DOCUMENTS

| 4,246,697 | A | | 1/1981 | Smith |
| 4,951,014 | A | * | 8/1990 | Wohlert et al. ............... 333/246 |
| 5,598,034 | A | | 1/1997 | Wakefield |
| 5,637,921 | A | * | 6/1997 | Burward-Hoy ............... 257/712 |
| 6,072,238 | A | | 6/2000 | Viswanathan et al. |
| 6,261,868 | B1 | | 7/2001 | Miller et al. |
| 6,292,374 | B1 | | 9/2001 | Johnson et al. |
| 6,462,413 | B1 | | 10/2002 | Polese et al. |
| 6,734,728 | B1 | | 5/2004 | Leighton et al. |
| 2001/0038310 | A1 | | 11/2001 | Olofsson et al. |
| 2004/0218363 | A1 | | 11/2004 | Wong |
| 2005/0029546 | A1 | | 2/2005 | Shigaki et al. |
| 2008/0144287 | A1 | | 6/2008 | Shigaki et al. |

FOREIGN PATENT DOCUMENTS

| EP | 1 562 230 A1 | 8/2005 |
| JP | 53-21577 A | 2/1978 |
| JP | 61-32592 A | 2/1986 |

(Continued)

OTHER PUBLICATIONS

U.S. Appl. No. 12/579,023, filed Oct. 14, 2009, Takagi, et al.

(Continued)

*Primary Examiner* — Colleen Matthews
(74) *Attorney, Agent, or Firm* — Oblon, Spivak, McClelland, Maier & Neustadt, L.L.P.

(57) ABSTRACT

A power amplifying semiconductor element is mounted in a package 13, having a heat dissipating surface acting as high frequency ground as well. The package 13 is mounted upside down with flip-chip mounting method in a concave portion 12 formed on a housing 11 having a high frequency ground acting as a heat dissipating surface as well. A cooling mechanism 14 thermally independent from that of the housing 11 is arranged on a heat dissipating base surface of the package 13 facing upward. The cooling mechanism 14 is composed of a heat dissipating fin 15 and a heat pipe 16. The present invention can prevent thermal influence upon other electronic components and can improve greatly the degree of freedom on the designing of the cooling system, because the cooling mechanism of the power amplifying semiconductor element is made independent from that of the housing 11.

6 Claims, 3 Drawing Sheets

FOREIGN PATENT DOCUMENTS

| | | |
|---|---|---|
| JP | 4-40536 | 4/1992 |
| JP | 4-373197 | 12/1992 |
| JP | 04-373197 A | 12/1992 |
| JP | 04373197 * | 12/1992 |
| JP | 7-94912 | 4/1995 |
| JP | 2000-243877 A | 9/2000 |
| JP | 2001-53508 A | 2/2001 |
| JP | 2003-110154 | 4/2003 |
| WO | WO 01/45169 A1 | 6/2001 |

OTHER PUBLICATIONS

U.S. Appl. No. 11/850,996, filed Sep. 6, 2007, Takagi.

U.S. Appl. No. 12/786,942, filed May 25, 2010, Takagi.

Extended European Search Report issued Dec. 22, 2010, in European Patent Application No. 07713567.1.

* cited by examiner

MOUNTING DEVICE FOR A SEMICONDUCTOR PACKAGE

CROSS-REFERENCE TO RELATED APPLICATIONS

This application is based upon and claims the benefit of priority from PCT Application No. PCT/JP2007/000185, filed on Mar. 8, 2007, which is based upon and claims the benefit of priority from the prior Japanese Patent Application No. 2006-065767, filed on Mar. 10, 2006, the entire contents of which are incorporated herein by reference.

BACKGROUND OF THE INVENTION

1. Field of the Invention

The present invention relates to a device for mounting a semiconductor package, especially relates to a device in which a package including a semiconductor element for power amplifying is mounted on a high frequency amplifier device having a microwave band.

2. Description of the Related Art

According to such a trend of large capacity communication as satellite communication in recent years, a demand for power amplifying semiconductor elements providing a high output power is increasing. At present, the output power of higher than 100 W is required in Ku band (12 to 15 GHz) application, and that of higher than 500 W is required in C band (4 to 8 GHz). However, it is important how to dissipate the heat generated by the power amplifying semiconductor elements more efficiently, when higher output power is aimed. This trend of high output power is ever increasing; therefore, heat dissipation of the semiconductor device is an important problem to be solved.

A conventional mounting device is shown in FIG. 1. A package 41 for the power amplifying semiconductor element is mounted on a base board of a system housing 42, in which water-cooling or air-cooling system is built-in, together with other electronic components 43, and heat is dissipated in an integrated form. Because heat dissipation from the power amplifying semiconductor elements is increasing as mentioned above, surrounding electronic components are exposed to high temperature, resulting in an adverse affect on characteristics of electronic components mounted in the surroundings. A problem associated with the conventional mounting method is that there is no design flexibility for the heat dissipation, because a heat dissipation plane of the package for the power amplifying semiconductor element is integrated with the system housing. Therefore, there is a demand to employ a mounting device which can cool power semiconductors independently from system housing.

As an example in which a semiconductor chips are not cooled separately and on a surface of a housing, there is a mounting device, in which a cooling fin is directly made contact with a semiconductor chip, or a semiconductor chip is die-bonded on a metal base by a spring force via heat conducting elastomer or heat conducting grease. This can be seen in a heat dissipation structure of a CPU chip or patent documents (refer to Japanese Unexamined Patent Application Publication No. H7-94912).

However, the semiconductor devices to which these kind of mounting techniques are applicable are those having a package of FC-PGA (Flip Chip Pin Grid Array) type or BGA (Ball Grid Array) type, which is unable to be cooled from the grid array surface. With respect to the mounting for high frequency power amplifying semiconductor elements outputting high power, the problem is unsolved.

BRIEF SUMMARY OF THE INVENTION

In order to solve the above-mentioned problems, according to an embodiment of the present invention, a mounting device for a semiconductor package is provided which includes a concave portion formed on a housing provided with a high frequency ground function and a heat dissipating function, a semiconductor package stored in the concave portion and a cooling mechanism located on the package. The semiconductor package is provided with a heat dissipating base face having a high frequency ground function, a semiconductor element mounted on the heat dissipating base face, a frame surrounding the periphery of the semiconductor element and a lid which covers air-tightly the space surrounded by the frame. The semiconductor package is stored in the concave portion formed in the housing so that the heat dissipating base face is arranged upside of the lid. The cooling mechanism is arranged on the heat dissipating base face.

According to the mounting device for a semiconductor package of the present invention, a system can be designed easily having a mounting device with excellent heat dissipation characteristics without spoiling electric characteristics at high frequency, because a heat generating face of a power semiconductor is separated from the system housing. With the construction, an independent heat dissipation system with higher freedom can be designed. Further, conduction of heat to electronic components near by can be inhibited, because the heat generating face is independent of the system housing. Further, if a heat pipe is used as a cooling mechanism, it can be operated effectively by so locating its heat radiating face to be upper position and its heat receiving face to be lower position, because the heat generating face is formed on the top surface of the housing.

DETAILED DESCRIPTION OF THE INVENTION

Figure 1:
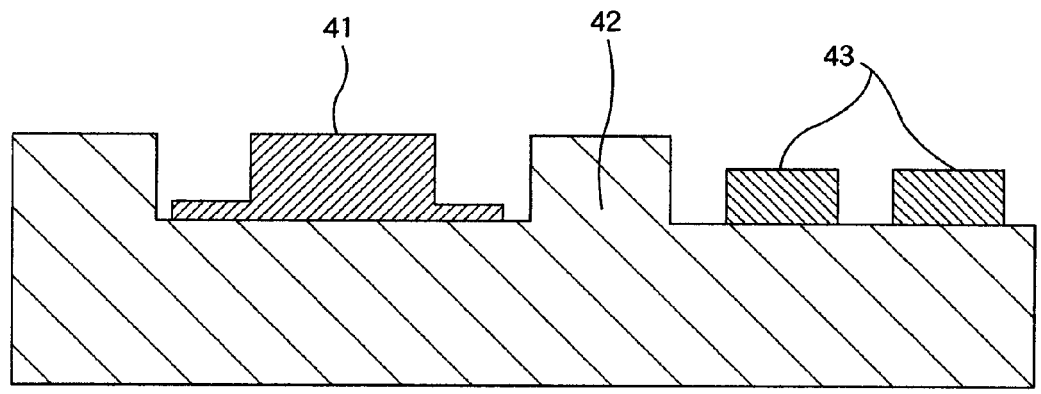
FIG. 1 is a cross sectional view showing a conventional mounting device for a semiconductor device.
Figure 2:
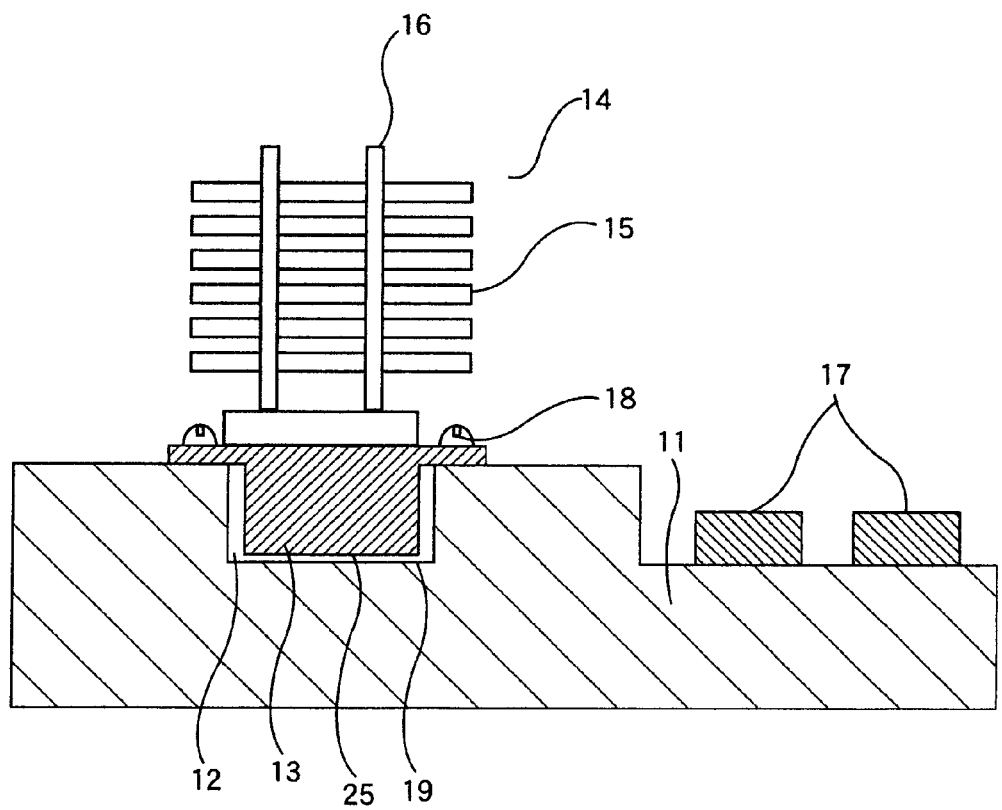
FIG. 2 is a cross sectional view showing a mounting device for a semiconductor package according to an embodiment of the present invention.

An embodiment of the present invention will be described below in detail. FIG. 2 is a cross sectional view of a mounting device according to an embodiment of the present invention.

A system housing 11 is composed of a block body which acts as a conductor forming a high frequency ground and as a heat dissipation body, and which is made of such cheap materials as Cu, Al, etc. of high heat conductivity. On a part of the system housing 11, a concave portion 12 is formed, inside which a package 13 storing a power amplifying semiconductor element is mounted in upside down with flip mount method like a flip-chip mounting method. Namely, in the package 13, the power amplifying semiconductor element is mounted on metal base surface acting as a heat dissipating surface as well as a high frequency ground conductor. Here, in the concave portion 12 of the system housing 11, the package 13 is so mounted so that the bottom surface of the heat dissipating metal base 20 faces upward and the main body of the package 13 is located inside the concave portion 12. A cooling mechanism 14, which is thermally independent from the system housing 11 is provided on the bottom surface of the heat dissipating metal base 20 of the package 13. The cooling mechanism 14 is composed of a heat dissipating fin 15, a heat pipe 16, and a copper block 16' in which the heat pipe 16 is embedded. On this system housing 11, other electronic components 17 are mounted as well.

Figure 3:
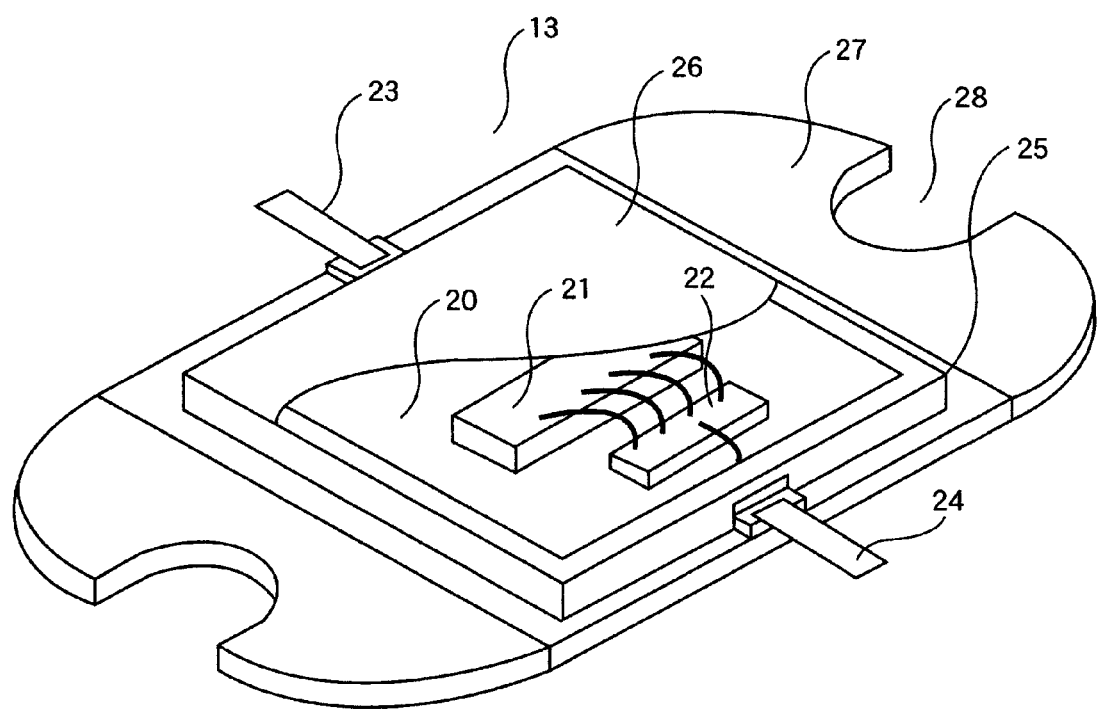
FIG. 3 is a perspective view showing a construction of a semiconductor package used in an embodiment of the present invention.

FIG. 3 is a partially cutout perspective view showing a structure of a package 13 for mounting the semiconductor element used in an embodiment of the present invention. In this package 13, a power amplifying semiconductor chip 21, an output matching circuit 22, or input matching circuit (not illustrated) are mounted on a heat dissipating metal base 20 made of such as gold-plated copper (Cu). Each of the input matching circuit or the output matching circuit 22 is connected with input/output terminal 23, 24 of feed through type respectively. The power amplifying semiconductor chip 21 is hermetically sealed with a frame 25 and a lid 26 in order to secure the reliability. A fixing flange 27 is formed in one body with the heat dissipating metal base 20 to fix the package 13 on the system housing 11. On the fixing flange 27, a notched portion 28 of a semicircular shape for screw clamping is formed. By fixing the fixing flange 27 with a screw 18 at this portion, a high frequency grounding and heat dissipation of the system housing 11 can be assured.

The package 13, on which the power amplifying semiconductor chip 21 and the output matching circuit 22 etc. are mounted, is flip-chip mounted upside down in the concave portion 12 formed on the system housing 11 while the input/output direction is kept unchanged. Here, the package 13 is fixed to the system housing 11 by passing the screw 18 through the semicircular notch portion 28 formed on the fixing flange 27.

Here, the lid 26, which is the lower face of the package, is so arranged as not to contact with the bottom face 19 of the concave portion 12, keeping a gap between them. If the lid 26, the lower face of the package, is made to contact with the bottom face 19 of the concave portion 12, there may be a case where the driving of the screw is imperfect when the heat dissipating metal base 20 of the package 13 is fixed by screw at the upper end of the concave portion 12. If the fixture by the screw 18 is imperfect, the electrical conduction between the heat dissipating metal base 20 and the upper end of the concave portion 12 remains imperfect, resulting that the system housing 11 including the concave portion 12 cannot maintain the high frequency ground potential on the basis of the heat dissipating metal base 20 of the package 13, and that the total characteristics are adversely influenced. For this reason, the depth of the concave portion 12 should be made a little bit larger than the height of the package 13 measured from the lower surface of the heat dissipating metal base 20 of the package 13. Grease or a gel elastomer having heat dissipating effect may be put in the gap. Because the heat dissipating metal base 20 forming the heat dissipating surface of the package 13 is facing upward, the cooling mechanism 14 thermally independent from the system housing 11 can be arranged on the metal base 20.

This cooling mechanism 14 is thermally independent from the system housing 11 as mentioned above. That is, this cooling mechanism 14 can improve the heat dissipating effect because not only it can be separated thermally from the system housing 11, but the cooling mechanism 14 can be arranged on the upper portion of the system housing 11. The heat of the heat dissipating fin 15 can be conducted to air and can move upward, and by the heat pipe 16 which is operated by heat convection principle, a further improvement of heat dissipation effect can be expected.

Other electronic components 17 such as a multiplexer, a demultiplexer, an input/output matching circuit, or a control circuit etc. are also mounted on this system housing 11, as mentioned above. By using a mechanism which can cool semiconductor elements of high output power separately, they can be thermally separated from other electronic components, the adverse influence of heat generation upon the characteristics can be avoided.

Figure 4:
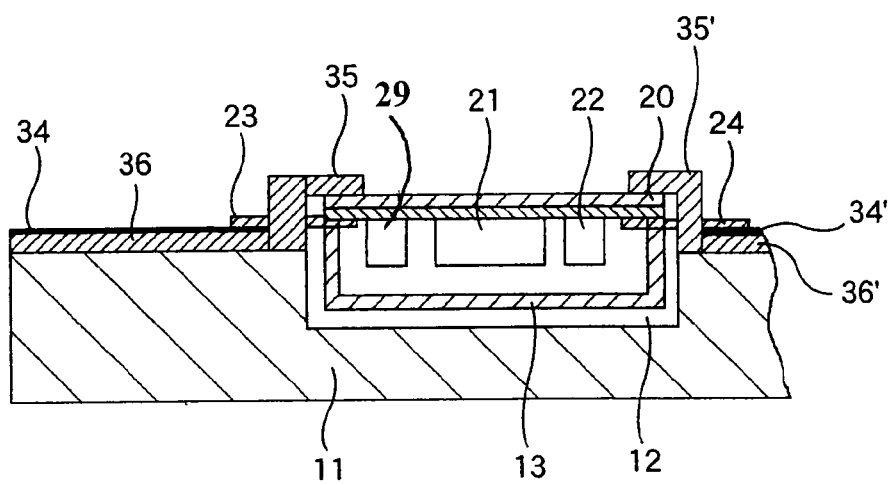
FIG. 4 shows a connecting of high frequency ground and housing ground of the package in the mounting device of the semiconductor device shown in FIG. 2, wherein (a) is a side sectional view and (b) is a plan view.
Figure 4:
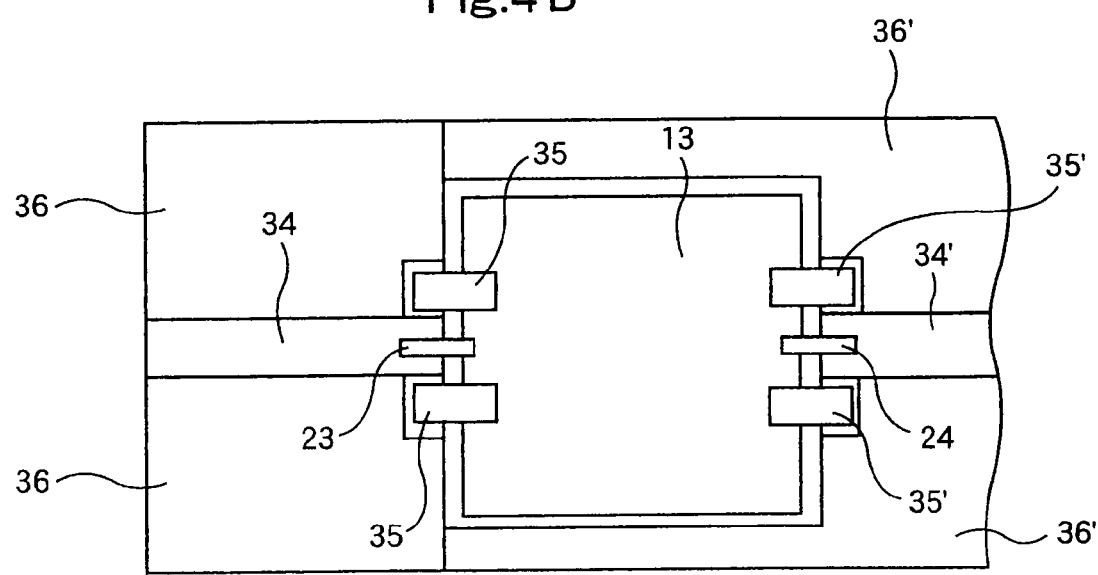

FIG. 4 shows a connection between the heat dissipating metal base 20 of the package 13 and the ground surface of the system housing 11 of the package shown in the embodiment in FIG. 2, wherein (a) is a side sectional view and (b) is a plan view. Also shown are input matching circuit 29, semiconductor chip 21 and output matching circuit 22.

Input/output terminals 23, 24 of the package 13 inversely mounted are connected with a microwave transmission line 34 formed on the system housing 11, as shown in these figures. The heat dissipating metal base 20 of the package 13 and the ground surface of the system housing 11 are connected electrically at both sides of the input terminal 23 by a connecting conductor 35. That is, at both sides of the end of the microwave transmission line 34, a part of insulator layer 36 under the microwave transmission line 34 is removed, and the underlying surface of the system housing 11 is exposed. One end of the connecting conductor 35 is connected with the system housing 11 at this exposed part. With this structure, high frequency characteristics are prevented from deterioration. Such connection between the heat dissipating metal base 20 of the package 13 and the ground surface of the system housing 11 is preferable to be done also at the output terminal 24 side of the package 13, in a similar manner with the input terminal 23 side mentioned above. Therefore, in the figure, components corresponding to the input terminal 23 side are assigned with same number attached with a "'" (dash), and detailed explanation is omitted.

With a mounting device of semiconductor element according to an embodiment of the present invention thus constructed, an independent heat dissipating system with high degree of design freedom can be obtained because a heat generating surface of a power semiconductor is formed independent from the system housing. Thus, a system having a mounting device with an excellent heat dissipating characteristics can easily be designed without impairing electrical characteristics in high frequency. Further, effect of heat conduction to other electronic components in the vicinity is inhibited, because the heat generating surface is separated from the system housing. Moreover, when a heat pipe is used as a cooling mechanism, it effectively functions because the heat generating surface is on the upper surface of the housing.

The present invention is not limited to the above-mentioned embodiment only, but can be brought into shape within a range not deviating from the scope of the invention at the practice stage. For example, as the fixing method of semiconductor package to the system housing, other suitable fixing method, for example, soldering may be used instead of screw fixing.

What is claimed is:

1. A mounting device for a semiconductor package comprising:
   a housing having a concave portion;
   a semiconductor package having a base, a semiconductor element on one side of the base, the semiconductor package being mounted on the housing so that a top surface of the semiconductor element opposes a bottom portion of the concave portion and a side opposing the top surface of the semiconductor element is mounted to the base; and a cooling mechanism provided on an opposing side of the base and on an outer side of the housing, wherein the base is provided with a high frequency ground function and the semiconductor package is provided with a frame surrounding the semiconductor element and a lid for covering the space surrounded by the frame, and wherein the base of the semiconductor package and the housing are connected by a ground connection conductor, thereby a high frequency ground of the semiconductor package and a high frequency ground of the housing are connected to each other.

2. A mounting device for a semiconductor package according to claim 1, wherein the semiconductor package is fixed to the housing by screw at the end of the base.

3. A mounting device for a semiconductor package according to claim 1, wherein the semiconductor package is arranged in the concave portion so that a gap is kept between the semiconductor package and the housing.

4. A mounting device for a semiconductor package according to claim 1, wherein the cooling mechanism comprises a heat dissipating fin and a heat pipe.

5. A mounting device for semiconductor package according to claim 1, further comprising:
an input side matching circuit; an output side matching circuit; an input terminal connected with the input side matching circuit; and an output terminal connected with the output side matching circuit;
wherein the housing is further provided with a microwave transmission line formed on the periphery of the concave portion through an insulating layer, and one end of the ground connection conductor is connected with the surface of the housing exposed by removing the insulating layer.

6. A mounting device for a semiconductor package according to claim 1, further comprising:
the lid covering the semiconductor package, which is disposed between a bottom of the concave portion and a top surface of the semiconductor element.

* * * * *